(12) United States Patent
Sakuma et al.

(10) Patent No.: US 9,147,826 B2
(45) Date of Patent: Sep. 29, 2015

(54) THIN FILM PIEZOELECTRIC ELEMENT, THIN FILM PIEZOELECTRIC ACTUATOR, AND THIN FILM PIEZOELECTRIC SENSOR; AND HARD DISK DRIVE, AND INKJET PRINTER

(71) Applicant: TDK CORPORATION, Tokyo (JP)

(72) Inventors: Hitoshi Sakuma, Tokyo (JP); Kazuhiko Maejima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 4 days.

(21) Appl. No.: 14/162,211

(22) Filed: Jan. 23, 2014

(65) Prior Publication Data

US 2015/0207057 A1    Jul. 23, 2015

(51) Int. Cl.
| | |
|---|---|
| *G11B 21/24* | (2006.01) |
| *H01L 41/047* | (2006.01) |
| *B41J 2/14* | (2006.01) |
| *G11B 5/48* | (2006.01) |

(52) U.S. Cl.
CPC ......... *H01L 41/0475* (2013.01); *B41J 2/14201* (2013.01); *G11B 5/4873* (2013.01); *G11B 21/24* (2013.01)

(58) Field of Classification Search
CPC ............. G11B 21/24; G11B 5/56; G11B 5/48
USPC ........................................... 360/294.4, 294.3
See application file for complete search history.

(56) References Cited

U.S. PATENT DOCUMENTS

| | | | |
|---|---|---|---|
| 5,504,388 A * | 4/1996 | Kimura et al. | 310/363 |
| 6,013,970 A | 1/2000 | Nishiwaki et al. | |
| 6,103,072 A | 8/2000 | Nishiwaki et al. | |
| 8,058,779 B2 | 11/2011 | Suenaga et al. | |
| 2003/0132683 A1 * | 7/2003 | Yamada et al. | 310/346 |
| 2004/0169442 A1 * | 9/2004 | Senoo et al. | 310/328 |
| 2006/0066691 A1 * | 3/2006 | Sakaida et al. | 347/71 |
| 2007/0228876 A1 * | 10/2007 | Sung | 310/320 |
| 2007/0236104 A1 * | 10/2007 | Fujii | 310/358 |
| 2010/0214369 A1 | 8/2010 | Naono et al. | |
| 2010/0244054 A1 * | 9/2010 | Ogihara et al. | 257/79 |
| 2013/0200748 A1 * | 8/2013 | Nakamura | 310/311 |
| 2013/0250007 A1 * | 9/2013 | Ishimori et al. | 347/70 |
| 2014/0091678 A1 * | 4/2014 | Koizumi et al. | 310/367 |
| 2014/0339961 A1 * | 11/2014 | Maejima et al. | 310/358 |
| 2014/0339962 A1 * | 11/2014 | Furukawa et al. | 310/363 |
| 2015/0064804 A1 * | 3/2015 | Horikiri et al. | 438/3 |

FOREIGN PATENT DOCUMENTS

| | | |
|---|---|---|
| JP | A-09-298324 | 11/1997 |
| JP | A-2010-161330 | 7/2010 |
| JP | A-2010-219493 | 9/2010 |

* cited by examiner

*Primary Examiner* — Allen T Cao

(74) *Attorney, Agent, or Firm* — Oliff PLC

(57) ABSTRACT

An object is to increase the amount of displacement of a thin-film piezoelectric element including a piezoelectric thin film having an uneven-shaped contact surface with the planar shape and the layer structure of the thin-film piezoelectric element kept unchanged. The thin-film piezoelectric element includes a pair of electrode layers and a piezoelectric thin film sandwiched between the pair of electrode layers, in which a surface roughness P-V of an interface between the piezoelectric thin film and at least one of the pair of electrode layers is 220 nm or more and 500 nm or less.

8 Claims, 7 Drawing Sheets

THIN FILM PIEZOELECTRIC ELEMENT, THIN FILM PIEZOELECTRIC ACTUATOR, AND THIN FILM PIEZOELECTRIC SENSOR; AND HARD DISK DRIVE, AND INKJET PRINTER

BACKGROUND OF INVENTION

1. Technical Field

The present invention relates to a thin-film piezoelectric element including a thin-film piezoelectric material, a thin-film piezoelectric actuator and a thin-film piezoelectric sensor each including the thin-film piezoelectric element, and a hard disk drive and an ink jet printer apparatus each including the thin-film piezoelectric actuator.

2. Related Background Art

In recent years, there have been advances in practical use of thin-film piezoelectric elements including thin-film piezoelectric materials, instead of bulk piezoelectric materials. Examples thereof include gyroscope sensors, pressure sensors, pulse wave sensors, shock sensors, and microphones, which serve as piezoelectric sensors using a piezoelectric effect, in which a force applied to a piezoelectric thin film is converted into a voltage; head assemblies for hard disk drives and ink jet print heads, which serve as piezoelectric actuators using an inverse piezoelectric effect, in which a piezoelectric thin film is deformed by the application of a voltage to the piezoelectric thin film; and speakers, beepers, and resonators, which also use the inverse piezoelectric effect.

A reduction in the thickness of piezoelectric materials enables the miniaturization of elements and widens the field of application. Furthermore, many elements can be collectively produced on a substrate, thereby increasing the mass productivity. There are many advantages in performance, for example, improvement in sensitivity as a sensor.

In the case where a piezoelectric thin film included in a thin-film piezoelectric element has a predetermined crystal structure, satisfactory piezoelectric properties are provided. Further improvement in crystallinity enables a piezoelectric constant to be further improved. Examples of a method for improving the crystallinity include the optimization of deposition conditions of deposition apparatuses configured to form piezoelectric thin films by sputtering, CVD, and so forth; and a method in which an underlying surface where a piezoelectric thin film will be formed is subjected to treatment.

PTL 1 states that a reduction in the surface roughness of a surface of an electrode layer serving as a base layer of a piezoelectric thin film improves the crystal orientation of the piezoelectric thin film during growth to increase the piezoelectric properties.

PTL 2 states that a piezoelectric thin film having high crystallinity optimum for improving a piezoelectric constant is formed by optimizing the crystal grain size of the piezoelectric thin film and the roughness of the piezoelectric thin film itself.

PTL 3 states that a piezoelectric thin film having an improved piezoelectric constant and resistance to dielectric breakdown is formed by suppressing a P-V value, which is defined by a peak-to-valley difference on the entire surface of the piezoelectric thin film.

[PTL 1] Japanese Unexamined Patent Application Publication No. 2010-161330

[PTL 2] Japanese Unexamined Patent Application Publication No. 09-298324

[PTL 3] Japanese Unexamined Patent Application Publication No. 2010-219493

SUMMARY OF INVENTION

As described in PTL 1, there is a method for reducing the roughness of a surface of an electrode layer serving as an underlying layer of a piezoelectric thin film as a method for improving the piezoelectric properties of a piezoelectric thin film.

Furthermore, the amount of displacement of a thin-film piezoelectric element is determined by a contact area between the piezoelectric thin film and an electrode layer in contact therewith. Thus, it is useful to have a larger contact area.

However, in the case where the size of the planar shape or the layer structure of a thin-film piezoelectric element is limited, the amount of displacement of the thin-film piezoelectric element is limited by the limits of the piezoelectric properties of the piezoelectric thin film according to the foregoing two facts.

The present invention has been accomplished in light of the foregoing problems. The present invention enables the amount of displacement of the thin-film piezoelectric element to be increased with the planar shape and the layer structure of the thin-film piezoelectric element kept unchanged.

A thin-film piezoelectric element according to the present invention includes a pair of electrode layers and a piezoelectric thin film sandwiched between the pair of electrode layers, in which a surface roughness P-V of an interface between the piezoelectric thin film and at least one of the pair of electrode layers is 220 nm or more and 500 nm or less. Here, the surface roughness P-V refers to a surface roughness value P-V defined by a difference between a maximum height (peak value P) and a minimum height (valley value V) on a surface.

The surface roughness of the interface is provided by the mechanical or chemical treatment of, for example, a surface of a film to be formed into an underlying layer before the formation of the piezoelectric thin film and/or the electrode layers. The surface roughness value P-V of the interface in a product state is measured by a method described below after the complete removal of the piezoelectric thin film or the electrode layer on the target interface.

This structure results in a larger real contact area (contact region) of a surface of the piezoelectric thin film in contact with the electrode layer than the apparent area (projected area). Thus, the piezoelectric thin film and the electrode layer are contacted in a wider area, so that the amount of displacement of the thin-film piezoelectric element determined by the contact area can be increased.

A surface roughness P-V of the interface of more than 500 nm causes difficulty in maintaining the smoothness of the contact surface between the piezoelectric thin film and the electrode layer as a thin-film piezoelectric element, causing variations in the growth direction of each layer constituting the thin-film piezoelectric element. At a surface roughness P-V of the interface of less than 220 nm, the effect of the present invention is not provided.

When the surface roughness of the interface is expressed by Ra, Ra is preferably 90 nm or more and 220 nm or less. The surface roughness Ra is preferably larger than an average crystal grain size of crystal grains constituting the piezoelectric thin film. Here, the average crystal grain size of the crystal grains constituting the piezoelectric thin film of the thin-film piezoelectric element according to the present invention is preferably 90 nm or more and 200 nm or less.

In the case of this structure, the crystallinity of the piezoelectric thin film on the interface having a predetermined surface roughness can be satisfactorily maintained, thereby increasing the amount of displacement of the thin-film piezoelectric element. Here, the average crystal grain size of the crystal grains is determined by observation of a cross section of the piezoelectric thin film. Details of a measurement method will be described below.

A surface roughness Ra of less than 90 nm causes a problem in which the increment of the contact area between the piezoelectric thin film and the electrode layer is not significantly changed, so that the amount of displacement of the thin-film piezoelectric element is difficult to increase.

In the case of an excessively large value of the surface roughness Ra, crystals of the piezoelectric thin film are divergently grown in arbitrary directions, thereby reducing the degree of orientation of the crystals important for the piezoelectric properties. To further improve the amount of displacement of the thin-film piezoelectric element, thus, the value of Ra is preferably 220 nm or less.

The reason the average crystal grain size of the crystal grains constituting the piezoelectric thin film is preferably 90 nm or more and 200 nm or less is that the piezoelectric thin film having a uniform crystal grain size can be grown in the foregoing range of the surface roughness Ra.

The degree of the effect of the shape of irregularities of the contact surface on the improvement of the amount of displacement is decreased as the thickness of the piezoelectric thin film in the thin-film piezoelectric element according to the present invention is increased. Thus, the piezoelectric thin film preferably has a thickness of 3000 nm or less. In the case where the thickness is small, a leakage current and a reduction in withstand voltage occur because of a pin hole or defective film growth. Thus the piezoelectric thin film preferably has a thickness of 220 nm or more.

The present invention is suitable for a thin-film piezoelectric element which is mechanically displaced on the basis of piezoelectric properties and whose size is limited because of its planar shape or layer structure. Furthermore, the present invention is useful for a thin-film piezoelectric element including a potassium sodium niobate-based piezoelectric thin film having satisfactory piezoelectric properties even with a small crystal grain size.

According to the present invention, a thin-film piezoelectric element having a specified shape can provide a larger amount of displacement. Furthermore, it is possible to improve the performance of a thin-film piezoelectric sensor and a thin-film piezoelectric actuator which include the element, and a hard disk drive and an ink jet printer which include them.

DESCRIPTION OF PREFERRED EMBODIMENTS

Preferred embodiments of the present invention will be described with reference to the drawings.

(Thin-film Piezoelectric Element)
(First Embodiment)

Figure 1:
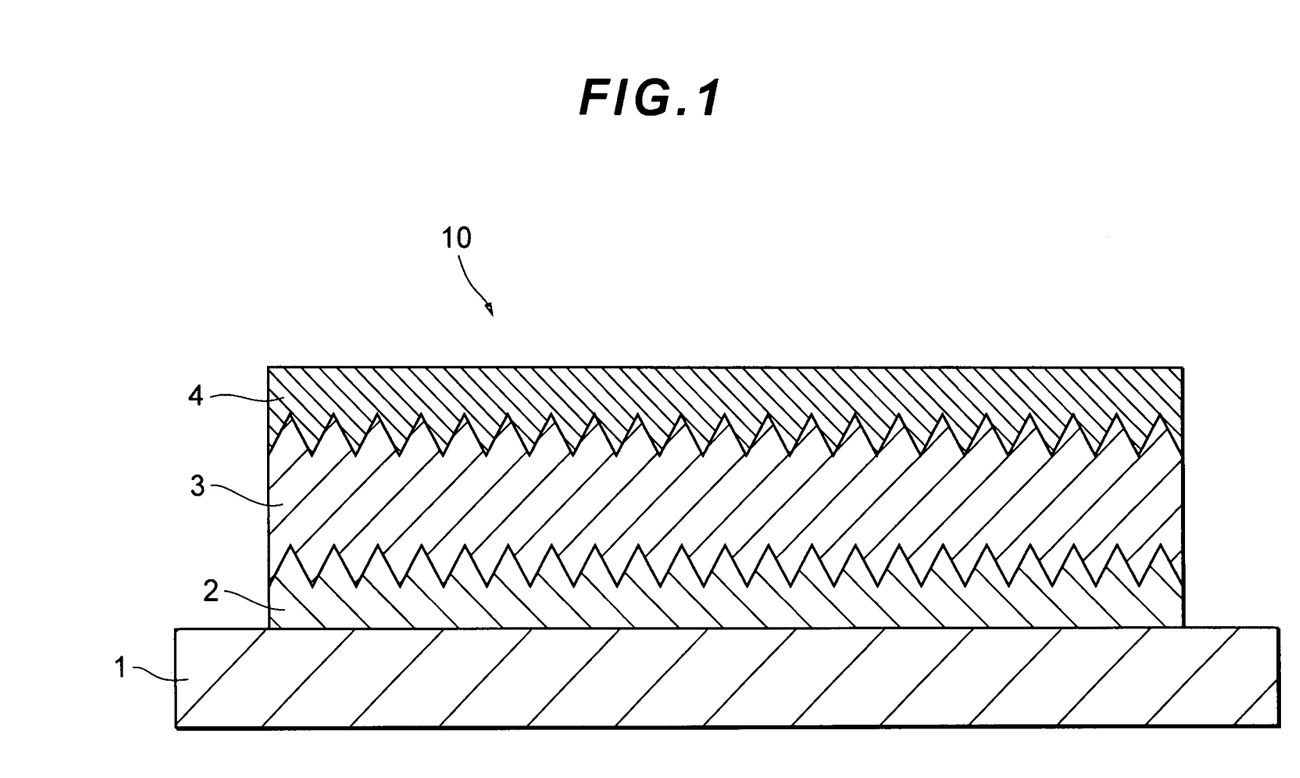
FIG. 1 is a structural drawing of a thin-film piezoelectric element according to a first embodiment of the present invention.

FIG. 1 illustrates the structure of a thin-film piezoelectric element 10 according to this embodiment.

As a substrate 1, for example, a single-crystal silicon substrate, a silicon-on-insulator (SOI) substrate, a silica glass substrate, a compound semiconductor substrate composed of GaAs or the like, a sapphire substrate, a metal substrate composed of stainless steel or the like, a MgO substrate, or a $SrTiO_3$ substrate may be used. In particular, a single-crystal silicon substrate is preferred from the viewpoint of the cost of the substrate and handleability in a process. The substrate 1 usually has a thickness of 10 to 1000 μm.

A lower electrode layer 2 is formed on the substrate 1. As a material for the lower electrode layer 2, Pt (platinum) or Rh (rhodium) is preferred. A method for forming the lower electrode layer 2 is a vapor deposition method or a sputtering method. The lower electrode layer 2 preferably has a thickness of 50 to 1000 nm.

The upper surface of the lower electrode layer 2 is subjected to surface treatment to roughen the upper surface or to form an uneven state of the upper surface in such a manner that the surface roughness P-V is 220 nm or more and 500 nm or less. Examples of a method of the treatment include wet etching methods with chemical solutions, dry etching methods by plasma treatment, and mechanical polishing methods, such as lapping and polishing. The resulting treated surface preferably has a surface roughness Ra of 90 nm or more and 220 nm or less. This surface treatment seemingly increases the substantial surface area of the lower electrode layer to about 2.5 to about 4 times larger than the surface area of the lower electrode layer that is not subjected to the surface treatment.

A piezoelectric thin film 3 is formed on the surface-treated lower electrode layer 2. The piezoelectric thin film 3 has a perovskite structure. Regarding a formation method thereof, the film is formed by a sputtering method in an atmosphere of a mixture of argon gas and oxygen gas with a high-frequency power supply. The thickness thereof is not particularly limited and is preferably 220 nm or more and 3000 nm or less.

As described above, as the piezoelectric thin film 3 having a perovskite structure, a lead-free potassium sodium niobate-based piezoelectric thin film is preferred. By adding an additive element, for example, Li (lithium), Ba (barium), Sr (strontium), Ta (tantalum), Zr (zirconium), or Mn (manganese), to the potassium sodium niobate-based piezoelectric thin film 3, also in the case where the average crystal grain size of crystal grains constituting the piezoelectric thin film 3 is 90 nm or more and 200 nm or less, the piezoelectric thin film 3 exhibits satisfactory piezoelectric properties.

The foregoing surface roughness Ra is preferably larger than the average crystal grain size of the crystal grains constituting the piezoelectric thin film 3.

The upper surface of the piezoelectric thin film 3 is subjected to surface treatment so as to have the same surface roughness as the upper surface of the lower electrode layer 2.

An upper electrode layer 4 is formed on the surface-treated piezoelectric thin film 3. A material for the upper electrode layer 4 is preferably Pt or Rh the same as in the lower electrode layer 2. The upper electrode layer 4 preferably has a thickness of 50 to 1000 nm.

The resulting stack including the piezoelectric thin film 3 is patterned by photolithography, a dry etching method, and a wet etching method to form 25 mm×5 mm regions. The substrate 1 is cut into pieces of the thin-film piezoelectric elements 10.

Removal of the substrate 1 from the thin-film piezoelectric element 10 may produce a thin-film piezoelectric element consisting of a stack alone. After the stack is patterned, a protective film composed of, for example, polyimide, may be formed.

(Second Embodiment)

Figure 2:
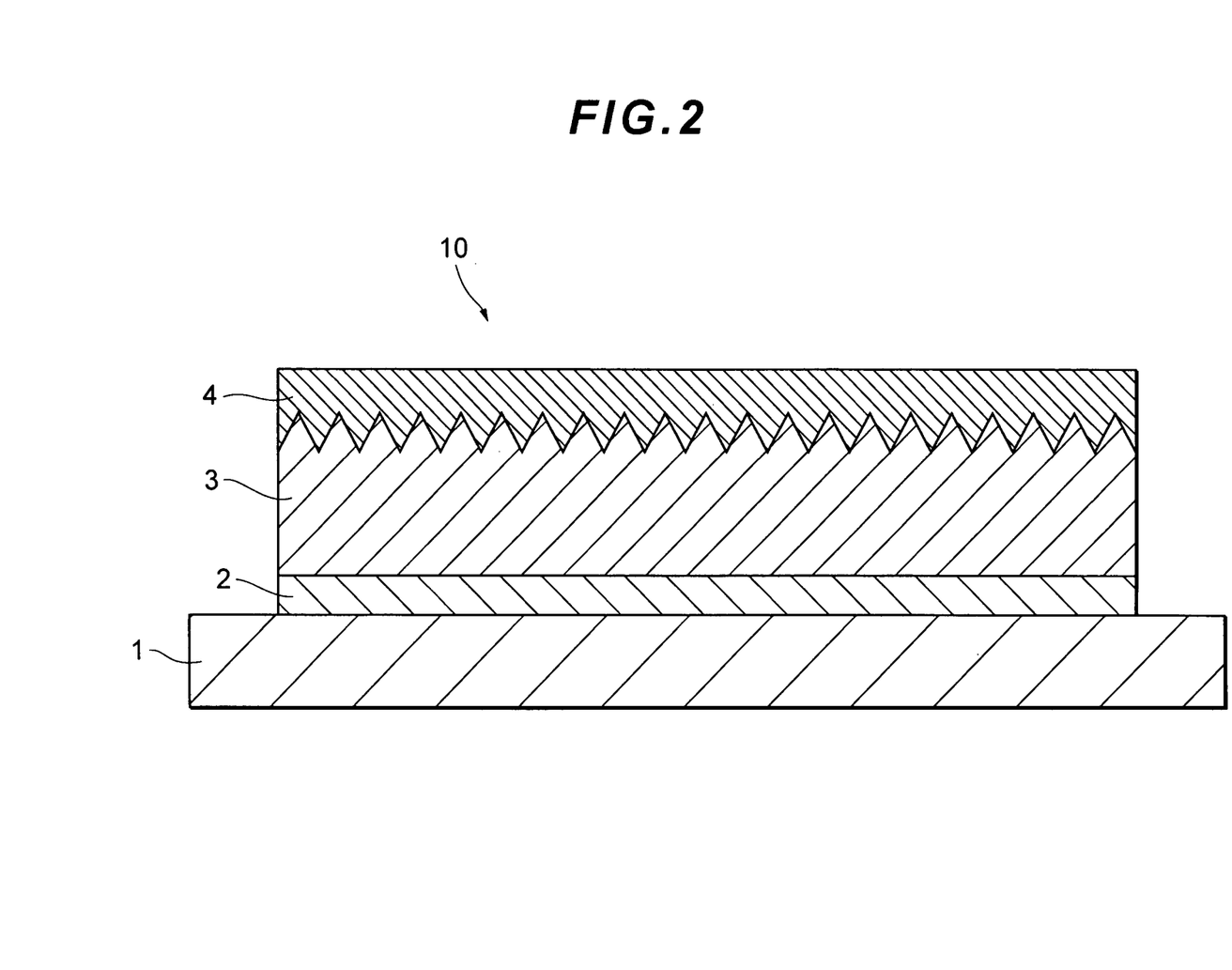
FIG. 2 is a structural drawing of a thin-film piezoelectric element according to a second embodiment of the present invention.

In the case where priority is given to the crystal growth with good quality in the formation of the piezoelectric thin film 3, the following embodiment is also preferred. FIG. 2 illustrates a thin-film piezoelectric element 10' according to this embodiment.

As with the first embodiment, as the substrate 1, for example, a single-crystal silicon substrate, a silicon-on-insulator (SOI) substrate, a silica glass substrate, a compound semiconductor substrate composed of GaAs or the like, a sapphire substrate, a metal substrate composed of stainless steel or the like, a MgO substrate, or a $SrTiO_3$ substrate may be used. In particular, a single-crystal silicon substrate is preferred from the viewpoint of the cost of the substrate and handleability in a process. The substrate 1 usually has a thickness of 10 to 1000 μm.

The lower electrode layer 2 is formed on the substrate 1. As a material for the lower electrode layer 2, Pt (platinum) or Rh (rhodium) is preferred. A method for forming the lower electrode layer 2 is a vapor deposition method or a sputtering method. The lower electrode layer 2 preferably has a thickness of 50 to 1000 nm.

The piezoelectric thin film 3 is formed on the lower electrode layer 2 without subjecting the upper surface of the lower electrode layer 2 to surface treatment. The structure, composition, and so forth of the piezoelectric thin film 3 are the same as in the first embodiment.

The upper surface of the piezoelectric thin film 3 is subjected to surface treatment to roughen the upper surface or to form an uneven state of the upper surface in such a manner that the surface roughness P-V is 220 nm or more and 500 nm or less. Examples of a method of the treatment include wet etching methods with chemical solutions, dry etching methods by plasma treatment, and mechanical polishing methods, such as lapping and polishing. The resulting treated surface preferably has a surface roughness Ra of 90 nm or more and 220 nm or less.

The upper electrode layer 4 is formed on the piezoelectric thin film 3. A material for the upper electrode layer 4 is preferably Pt or Rh the same as in the lower electrode layer 2. A method for forming the upper electrode layer 4 is also a vapor deposition method or a sputtering method. The upper electrode layer 4 preferably has a thickness of 50 to 1000 nm.

The resulting stack including the piezoelectric thin film 3 is patterned by photolithography, a dry etching method, and a wet etching method to form 25 mm×5 mm regions. The substrate 1 is cut into pieces of the thin-film piezoelectric elements 10'.

Removal of the substrate 1 from the thin-film piezoelectric element 10' may produce a thin-film piezoelectric element consisting of a stack alone. After the stack is patterned, a protective film composed of, for example, polyimide, may be formed.

Subsequent to the removal of the substrate 1, the lower electrode layer 2 may be removed, the lower surface of the piezoelectric thin film 3 may be subjected to surface treatment so as to have the same surface roughness as the upper surface of the piezoelectric thin film 3 to roughen the lower surface or to form an uneven state of the lower surface, and then a lower electrode layer may be formed on the lower surface again.

(Method for Evaluating Thin-film Piezoelectric Element)

Methods for evaluating the thin-film piezoelectric elements 10 and 10' according to the embodiments are described below.

(i) Calculation of Surface Roughness P-V

In each of the production processes for the thin-film piezoelectric elements 10 and 10', after the surface treatment subsequent to the formation of the lower electrode layer 2, and after the surface treatment subsequent to the formation of the piezoelectric thin film 3, a maximum height (peak value P) and a minimum height (valley value V) on the upper surface of the lower electrode layer 2 or the piezoelectric thin film 3 are measured with a profilometer. The length of measurement is preferably 15 to 18 mm in the longitudinal direction of a portion located at the center in the width direction of each of the lower electrode layer 2 and the piezoelectric thin film 3.

(ii) Calculation of Surface Roughness Ra

In each of the production processes for the thin-film piezoelectric elements 10 and 10', after the surface treatment subsequent to the formation of the lower electrode layer 2, and after the surface treatment subsequent to the formation of the piezoelectric thin film 3, a surface state of a freely-selected portion is observed with an atomic force microscope (AFM) to calculate the surface roughness Ra. The range of observation is preferably 5 to 10 μm.

(iii) Measurement of Amount of Displacement

The displacement of each of the thin-film piezoelectric elements 10 and 10' at their end portions is measured with a laser Doppler vibrometer and an oscilloscope while a voltage of 3 $V_{p-p}$ or 20 $V_{p-p}$ at 700 Hz was applied between the lower and upper electrode layers 2 and 4 of each of the thin-film piezoelectric elements 10 and 10'.

(iv) Measurement of Average Crystal Grain Size of Piezoelectric Thin Film

After the formation of the piezoelectric thin film 3 or the formation of the upper electrode layer 4, the resulting stack is cut in the thickness direction of the piezoelectric thin film 3 by machining or FIB. The cut section is observed with SEM or TEM. Here, upon letting the thickness of the piezoelectric thin film 3 be T, and letting the width of an observation region be W, W=T. A T×W region is observed. Next, equivalent circle diameters of crystal grains constituting the piezoelectric thin film 3 in the observation region are determined. The weighted average value is defined as an average grain size of the piezoelectric thin film 3. The average crystal grain size of the piezoelectric thin film 3 in a product may also be determined in a similar fashion.

(Thin-film Piezoelectric Actuator)

Figure 3A:
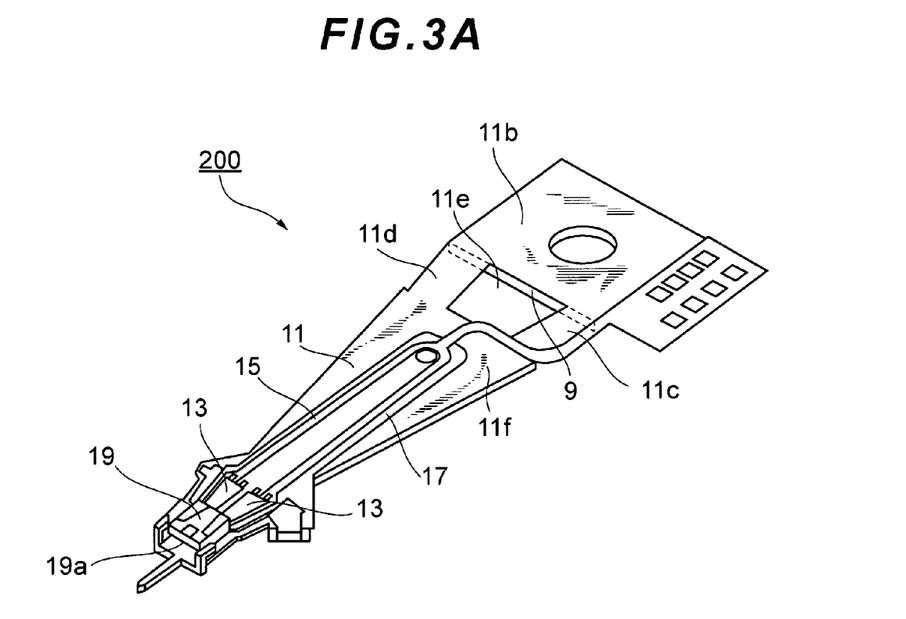
FIGS. 3A and 3B are structural drawings of thin-film piezoelectric actuators according to the present invention.

FIG. 3A is a structural drawing of a head assembly mounted on a hard disk drive (hereinafter, also referred to as an "HDD") as an example of a thin-film piezoelectric actuator including the thin-film piezoelectric element. As illustrated in the drawing, a head assembly 200 includes, as main components, a base plate 9, a load beam 11, a flexure 17, first and second thin-film piezoelectric elements 13 serving as driving elements, and a slider 19 equipped with a head element 19a.

The load beam 11 includes a base end portion 11b fixed to the base plate 9 by, for example, beam welding; first and second plate springs 11c and 11d extending from the base end portion 11b in a tapered shape; an opening 11e formed between the first and second plate springs 11c and 11d; and a main beam portion 11f which is continuous with the first and second plate springs 11c and 11d and which extends linearly in the tapered shape.

The first and second thin-film piezoelectric elements 13 are arranged on a flexible wiring board 15, which is part of the flexure 17, with a predetermined distance kept therebetween.

The slider 19 is fixed to the tip of the flexure 17 and moves rotationally as the first and second thin-film piezoelectric elements 13 expand and contract.

Each of the first and second thin-film piezoelectric elements 13 includes an upper electrode layer, a lower electrode layer, and a piezoelectric thin film sandwiched between the upper and lower electrode layers. In the case where a piezoelectric thin film of a thin-film piezoelectric element that exhibits a large amount of displacement according to the present invention is used as the piezoelectric thin film, it is possible to achieve a sufficient amount of displacement.

Figure 3B:
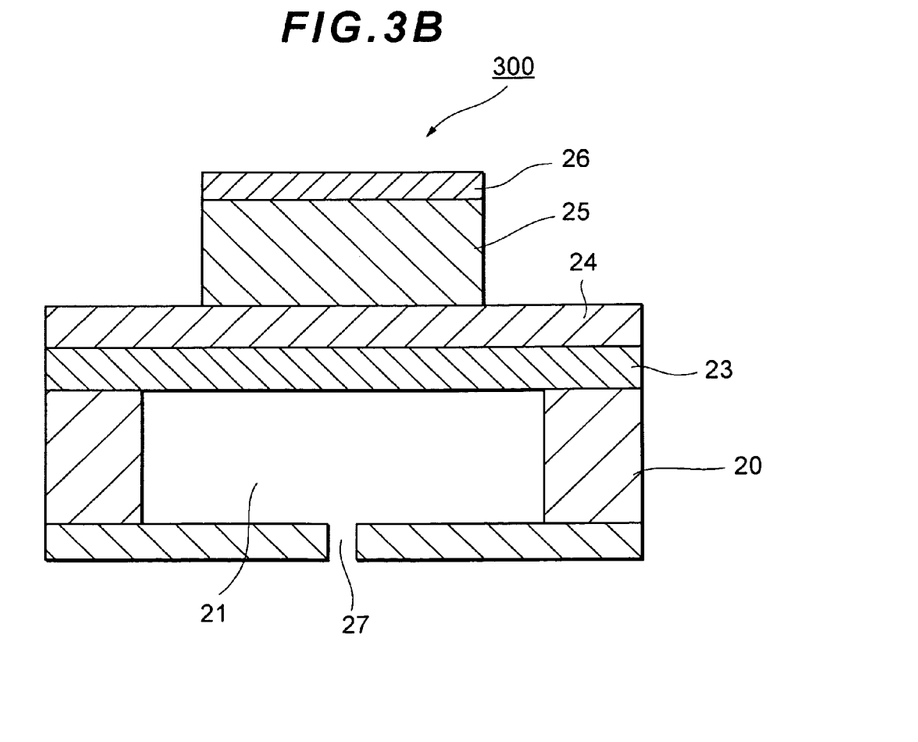

FIG. 3B is a structural drawing of a thin-film piezoelectric actuator of an ink jet printer head as another example of the thin-film piezoelectric actuator including the thin-film piezoelectric element.

A thin-film piezoelectric actuator 300 includes an insulating film 23, a lower electrode layer 24, a piezoelectric thin film 25, and an upper electrode layer 26 stacked on a base 20.

In the case where a predetermined ejection signal is not fed and where a voltage is not applied between the lower electrode layer 24 and the upper electrode layer 26, the piezoelectric thin film 25 is not deformed. A pressure in a pressure chamber 21 provided with a thin-film piezoelectric element to which an ejection signal is not fed is not changed, so that an ink droplet is not ejected from a nozzle 27.

In the case where a predetermined ejection signal is fed and where a fixed voltage is applied between the lower electrode layer 24 and the upper electrode layer 26, the piezoelectric thin film 25 is deformed. In the pressure chamber 21 provided with the thin-film piezoelectric element to which the ejection signal is fed, the insulating film 23 is largely bent. Thus, the pressure in the pressure chamber 21 is instantaneously increased, thereby ejecting an ink droplet from the nozzle 27.

Here, in the case where a piezoelectric thin film of a thin-film piezoelectric element that exhibits a large amount of displacement according to the present invention is used as the piezoelectric thin film, it is possible to achieve a sufficient amount of displacement.

(Thin-film Piezoelectric Sensor)

Figure 4A:
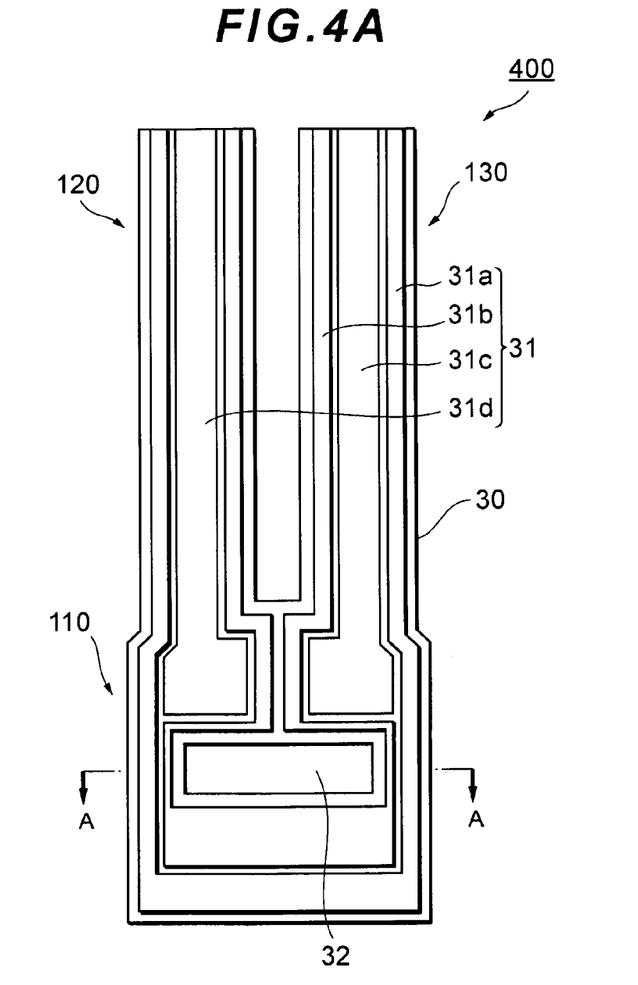
FIGS. 4A to 4D are structural drawings of thin-film piezoelectric sensors according to the present invention.
Figure 4B:
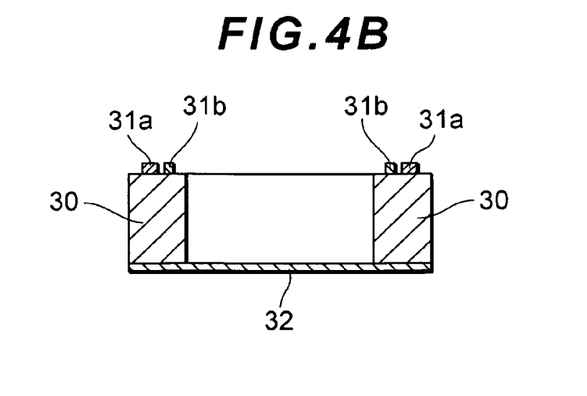

FIG. 4A is a structural drawing (plan view) of a gyroscope sensor as an example of a thin-film piezoelectric sensor including the thin-film piezoelectric element. FIG. 4B is a cross-sectional view taken along line A-A in FIG. 4A.

A gyroscope sensor 400 is a tuning fork-type angular velocity detecting element that includes a base portion 110 and two arms 120 and 130 connected to a surface of the base portion 110. The gyroscope sensor 400 is produced by microfabrication of a piezoelectric thin film 30, an upper electrode layer 31, and a lower electrode layer 32, which constitute the thin-film piezoelectric element, into the shape of a tuning fork-type resonator. The components (the base portion 110 and the arms 120 and 130) are integrally formed into a thin-film piezoelectric element.

Driving electrode layers 31$a$ and 31$b$ and a detection electrode layer 31$d$ are formed on a first main surface of one arm 120. Similarly, the driving electrode films 31$a$ and 31$b$ and a detection electrode layer 31$c$ are formed on a first surface of the other arm 130. These electrode layers 31$a$, 31$b$, 31$c$, and 31$d$ are formed by etching the upper electrode layer 31 into a predetermined electrode shape.

The lower electrode layer 32 is entirely formed on a second main surface (a main surface opposite the first main surface) of each of the base portion 110 and the arms 120 and 130 and functions as a ground electrode of the gyroscope sensor 400.

Here, letting the longitudinal direction of each of the arms 120 and 130 be a Z direction, and letting a plane including the main surfaces of the two arms 120 and 130 be an XZ plane, a rectangular coordinate system XYZ is defined.

When a driving signal is fed to the driving electrode layers 31$a$ and 31$b$, the two arms 120 and 130 are excited in an in-plane vibration mode. The in-plane vibration mode refers to a vibration mode in which the two arms 120 and 130 vibrate in a direction parallel to the main surfaces of the two arms 120 and 130. For example, when the one arm 120 is excited in a −X direction at a velocity of V1, the other arm 130 is excited in a +X direction at a velocity of V2.

In the case where the gyroscope sensor 400 is rotated at angular velocity of ω around the Z-axis as the axis of rotation in this state, the Coriolis force acts on each of the arms 120 and 130 in a direction orthogonal to the direction of vibration, so that they start to be excited in an out-plane vibration mode. The out-plane vibration mode refers to a vibration mode in which the two arms 120 and 130 vibrate in a direction orthogonal to the main surfaces of the two arms 120 and 130. For example, when the Coriolis force F1 acts on the one arm 120 in a −Y direction, the Coriolis force F2 acts on the other arm 130 in a +Y direction.

The magnitude of the Coriolis forces F1 and F2 is proportional to the angular velocity ω. Thus, the mechanical strains of the arms 120 and 130 due to the Coriolis forces F1 and F2 are converted by the piezoelectric thin film 30 into electrical signals (detection signals). The electrical signals can be taken from the detection electrode layers 31$c$ and 31$d$ to determine the angular velocity ω.

In the case where a piezoelectric thin film of a thin-film piezoelectric element that exhibits a large amount of displacement according to the present invention is used as the piezoelectric thin film, it is possible to achieve sufficient detection sensitivity.

Figure 4C:
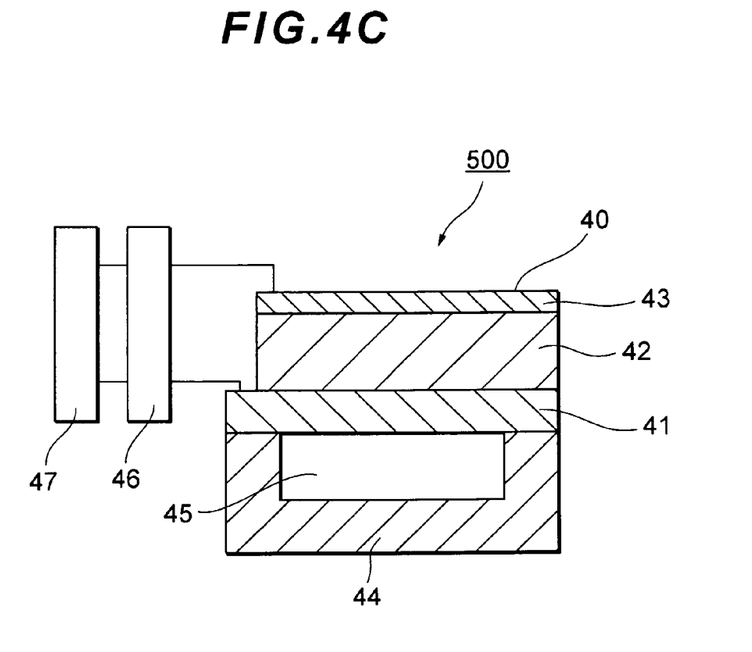

FIG. 4C is a structural drawing of a pressure sensor as a second example of the thin-film piezoelectric sensor including the thin-film piezoelectric element.

A pressure sensor 500 includes a cavity 45 configured to respond when subjected to pressure; a support 44 that supports a thin-film piezoelectric element 40; a current amplifier 46; and a voltage-measuring device 47. The thin-film piezoelectric element 40 includes a common electrode layer 41, a piezoelectric thin film 42, and an individual electrode layer 43 stacked, in that order, on the support 44. Here, when an external force is applied, the thin-film piezoelectric element 40 is bent, so that a voltage is detected by the voltage-measuring device 47.

In the case where a piezoelectric thin film of a thin-film piezoelectric element that exhibits a large amount of displacement according to the present invention is used as the piezoelectric thin film, it is possible to achieve sufficient detection sensitivity.

Figure 4D:
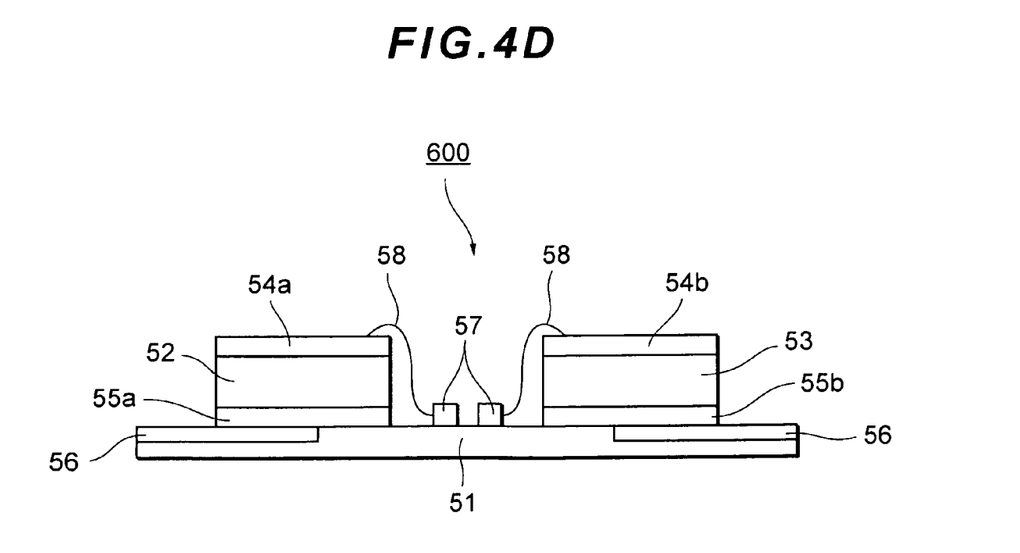

FIG. 4D is a structural view of a pulse wave sensor as a third example of the thin-film piezoelectric sensor including the thin-film piezoelectric element.

A pulse wave sensor 600 includes a transmission thin-film piezoelectric element and a receiving thin-film piezoelectric element on a substrate 51. Here, in the transmission thin-film piezoelectric element, electrode layers 54$a$ and 55$a$ are formed on surfaces of a transmission piezoelectric thin film 52 in the thickness direction. In the receiving thin-film piezoelectric element, electrode layers 54$b$ and 55$b$ are formed on surfaces of a receiving piezoelectric thin film 53 in the thickness direction. Electrodes 56 and upper surface electrodes 57 are formed on the substrate 51. Each of the electrode layers 54$a$ and 54$b$ is electrically connected to the respective upper surface electrodes 57 with a wire 58.

To detect the pulse wave of a living body, the back surface of the substrate of the pulse wave sensor 600 (a surface on which the thin-film piezoelectric element is not mounted) is brought into contact with the living body. A specific driving voltage signal is sent to the electrode layers 54a and 55a of the transmission thin-film piezoelectric element at the time of detection of the pulse wave. The transmission thin-film piezoelectric element is excited in response to the driving voltage signal sent to the electrode layers 54a and 55a to generate ultrasound and transmits the ultrasound into the living body. The ultrasound transmitted into the living body is reflected from a blood flow and received by the receiving thin-film piezoelectric element. The receiving thin-film piezoelectric element converts the received ultrasound into a voltage signal and sends the signal from the electrode layers 54b and 55b.

In the case where a piezoelectric thin film of a thin-film piezoelectric element that exhibits a large amount of displacement according to the present invention is used as each of the piezoelectric thin films, it is possible to achieve sufficient detection sensitivity.

(Hard Disk Drive)

Figure 5:
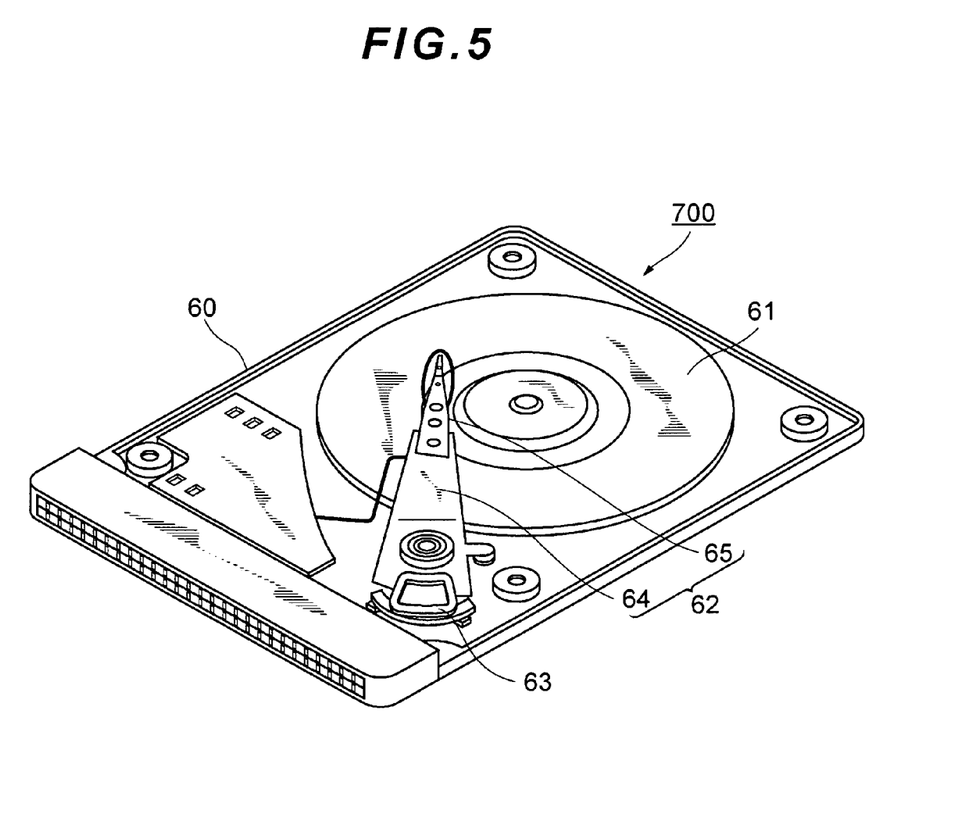
FIG. 5 is a structural drawing of a hard disk drive according to the present invention.

FIG. 5 is a structural drawing of a hard disk drive on which the head assembly illustrated in FIG. 3A is mounted.

A hard disk drive 700 is provided with a hard disk 61 as a recording medium and a head stack assembly 62 configured to record and reproduce magnetic information in a housing 60. The hard disk 61 is rotated by a motor that is not illustrated.

The head stack assembly 62 is a component in which a plurality of assemblies each including an actuator arm 64 pivotally supported around a pivot axis by a voice coil motor 63 and a head assembly 65 connected to the actuator arm 64 are stacked in the direction of depth. The slider 19 is attached to the tip of the head assembly 65 so as to face the hard disk 61 (see FIG. 3A).

For the head assembly 65 (200), a method for moving the head element 19a (see FIG. 3A) in two modes is employed. A relatively large movement of the head element 19a is controlled by driving the whole of the head assembly 65 and the actuator arm 64 with the voice coil motor 63. A fine movement is controlled by driving the slider 19 at the tip of the head assembly 65.

In the thin-film piezoelectric element used in the head assembly 65, in the case where a piezoelectric thin film of a thin-film piezoelectric element that exhibits a large amount of displacement according to the present invention is used as the piezoelectric thin film, it is possible to achieve sufficient accessibility.

(Ink Jet Printer Apparatus)

Figure 6:
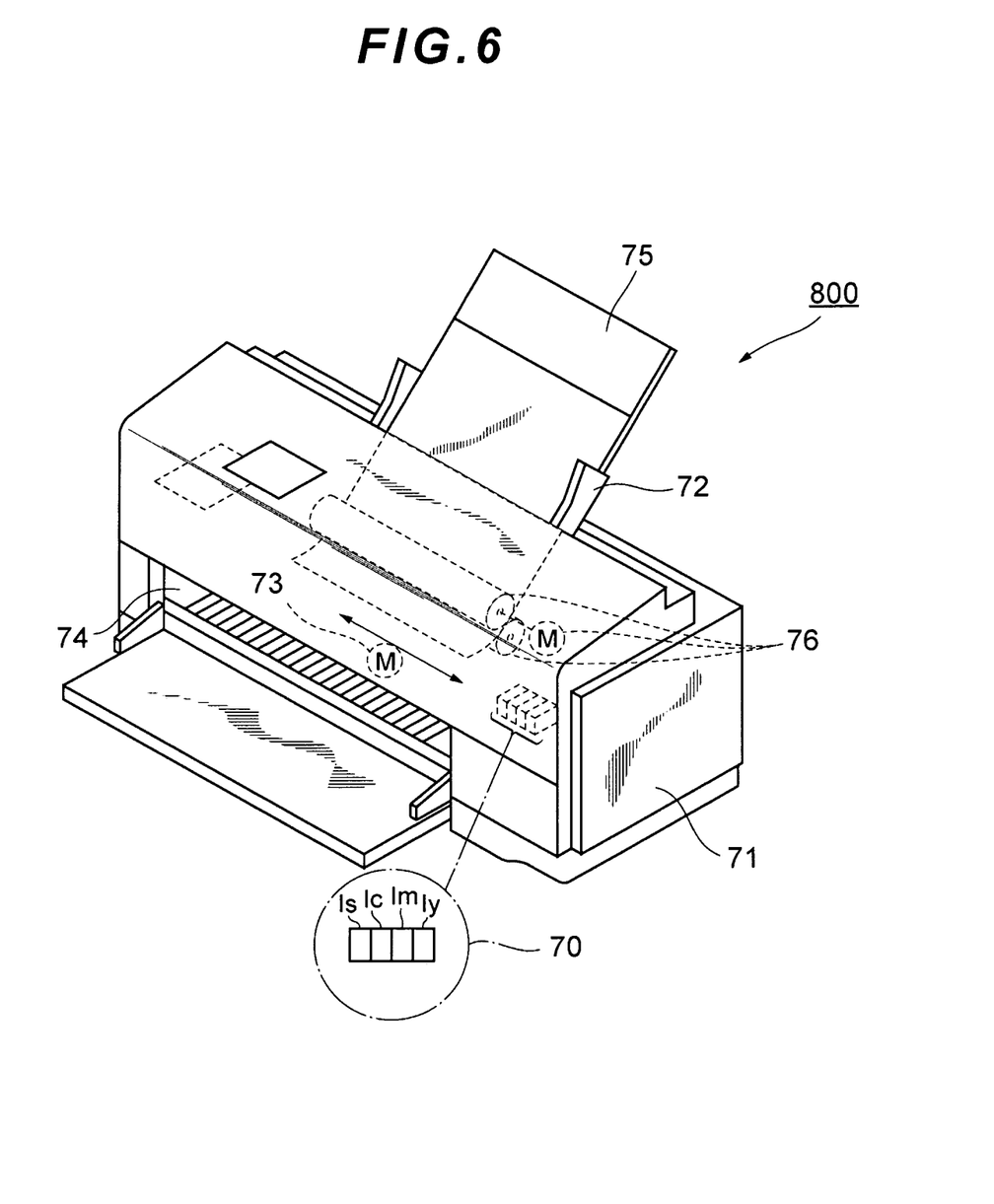
FIG. 6 is a structural drawing of an ink jet printer apparatus according to the present invention.

FIG. 6 is a structural drawing of an ink jet printer apparatus on which the ink jet printer head illustrated in FIG. 3B is mounted.

An ink jet printer apparatus 800 mainly includes an ink jet printer head 70, a main body 71, a tray 72, and a head-driving mechanism 73. The ink jet printer head 70 is equipped with the thin-film piezoelectric actuator 300.

The ink jet printer apparatus 800 is provided with ink cartridges of a total of four colors, yellow, magenta, cyan, and black, and is configured to provide full-color printing. The ink jet printer apparatus 800 includes a special controller board and so forth therein. The controller board controls ink ejection timing from the ink jet printer head 70 and the scan of the head-driving mechanism 73. The main body 71 is provided with the tray 72 on a back panel and an automatic sheet feeder (automatic continuous document feeder mechanism) 76 therein. The automatic sheet feeder 76 automatically feeds recording paper 75 and delivers the recording paper 75 from a front outlet 74.

Regarding the thin-film piezoelectric element used for the thin-film piezoelectric actuator of the ink jet printer head 70, in the case where a piezoelectric thin film of a thin-film piezoelectric element that exhibits a large amount of displacement according to the present invention is used as the piezoelectric thin film, it is possible to provide a high-safety ink jet printer apparatus.

EXAMPLES

While the present invention will be more specifically described below on the basis of examples and comparative examples, the present invention is not limited to these examples described below.

Example 1

A silicon (100) substrate 1 having a thickness of 400 μm was heated to 400° C. Pt was epitaxially grown by a sputtering method on the silicon substrate 1 to form a 200-nm-thick Pt film serving as the lower electrode layer 2 in such a manner that the Pt film was oriented to the plane of the silicon substrate 1. In this case, the deposition rate was 0.2 nm/sec.

The lower electrode layer 2 was sputter-etched with argon gas at a gas pressure of 0.5 Pa. As a power supply used for application, a high-frequency power supply was used. The output power was 600 W and applied to an area with a diameter of 76 mm. A treatment time was 60 seconds. Then the surface roughness P-V and Ra of the treated surface were calculated.

The silicon substrate 1 was heated to 550° C. Potassium sodium niobate (KNN) was epitaxially grown by a sputtering method with an argon-oxygen (Ar+$O_2$) gas mixture having an oxygen ($O_2$) concentration of 5% at a gas pressure of 0.2 Pa to form a 2000-nm-thick film serving as the piezoelectric thin film 3. As a power supply used for application, a high-frequency power supply was used. A sputtering target having a diameter of 150 mm was used. The output power was 800 W. The composition of the sputtering target used was as follows: $(K_{0.5}Na_{0.5})NbO_3$.

As with the lower electrode layer 2, the piezoelectric thin film 3 was sputter-etched under the same conditions.

The average crystal grain size of the piezoelectric thin film 3 formed by the foregoing method was determined by observation with a transmission electron microscope (TEM) and found to be about 180 nm.

A Pt film having a thickness of 200 nm was formed as the upper electrode layer 4 by a sputtering method at room temperature. In this case, the deposition rate was 0.2 nm/sec.

After the formation of the upper electrode layer 4, the piezoelectric thin film 3, the lower electrode layer 2, and the upper electrode layer 4 were patterned by photolithography, dry etching, and wet etching. Furthermore, the substrate 1 was cut to form the thin-film piezoelectric elements 10 each having a moving portion with a size of 25 mm×5 mm according to EXAMPLE 1.

Example 2

The thin-film piezoelectric elements 10 according to EXAMPLE 2 were produced under the same conditions as in EXAMPLE 1, except that in the sputter-etching of the lower electrode layer 2 and the piezoelectric thin film 3 with argon gas, the output power of the high-frequency power supply was 800 W, and the treatment time was 120 seconds. In the course of the production, the surface roughness P-V and Ra of the treated surface were calculated.

Example 3

The thin-film piezoelectric elements 10 according to EXAMPLE 3 were produced under the same conditions as in EXAMPLE 1, except that in the sputter-etching of the lower electrode layer 2 and the piezoelectric thin film 3 with argon gas, the output power of the high-frequency power supply was 1200 W, and the treatment time was 180 seconds. In the course of the production, the surface roughness P-V and Ra of the treated surface were calculated.

Example 4

The thin-film piezoelectric elements 10 according to EXAMPLE 4 were produced under the same conditions as in EXAMPLE 1, except that in the sputter-etching of the lower electrode layer 2 and the piezoelectric thin film 3 with argon gas, the output power of the high-frequency power supply was 750 W, and the treatment time was 90 seconds. In the course of the production, the surface roughness P-V and Ra of the treated surface were calculated.

Example 5

The thin-film piezoelectric elements 10 according to EXAMPLE 5 were produced under the same conditions as in EXAMPLE 2, except that the thickness of the piezoelectric thin film 3 epitaxially grown by the sputtering method was 4000 nm. In the course of the production, the surface roughness P-V and Ra of the treated surface were calculated.

Example 6

As the surface treatment for the lower electrode layer 2 and the piezoelectric thin film 3, mechanical polishing was performed with alumina abrasive grains having a grain size of 5 μm at a pressure of 0.8 MPa. In this case, the number of rotation of the substrate was 200 rpm, and the treatment time was 120 seconds. The thin-film piezoelectric elements 10 according to EXAMPLE 6 were produced under the same conditions as in EXAMPLE 1, except for this surface treatment. In the course of the production, the surface roughness P-V and Ra of the treated surface were calculated. It is obvious that any other abrasive grains may be used in place of the alumina abrasive grains used for the mechanical polishing in this example.

Example 7

The thin-film piezoelectric elements 10 according to EXAMPLE 7 were produced under the same conditions as in EXAMPLE 6, except that in the mechanical polishing of the lower electrode layer 2 and the piezoelectric thin film 3, the surface treatment was performed by mechanical polishing with alumina abrasive grains having a grain size of 10 μm at a pressure of 1.2 MPa. In the course of the production, the surface roughness P-V and Ra of the treated surface were calculated.

Example 8

As with EXAMPLE 1, the lower electrode layer 2 was formed on the silicon substrate 1. Then the silicon substrate 1 provided with the lower electrode layer 2 was immersed in an aqueous mixture of nitric acid ($HNO_3$) and hydrochloric acid (HCl) for 90 minutes to wet-etch a surface of the lower electrode layer 2. An etchant used here was a mixture of a 60% $HNO_3$ solution and a 35% HCl solution in a ratio of 1:3. Then the surface roughness P-V and Ra of the treated surface were calculated.

The silicon substrate 1 was heated to 550° C. Potassium sodium niobate (KNN) was epitaxially grown by a sputtering method with an argon-oxygen (Ar+$O_2$) gas mixture having an oxygen ($O_2$) concentration of 5% at a gas pressure of 0.2 Pa to form a 2000-nm-thick film serving as the piezoelectric thin film 3. As a power supply used for application, a high-frequency power supply was used. A target having a diameter of 150 mm was used. The output power was 800 W. The composition of the sputtering target used was the same as in EXAMPLE 1.

The silicon lower electrode layer 2 provided with the piezoelectric thin film 3 was immersed in an aqueous mixture of nitric acid ($HNO_3$) and hydrofluoric acid (HF) for 100 minutes to wet-etch a surface of the piezoelectric thin film 3. An etchant used here was a mixture of a 60% $HNO_3$ solution and 50% HF solution in a ratio of 1:1. It is obvious that any other etchant may be used in place of the etchant used in the wet etching in this example, depending on a target object.

A Pt film having a thickness of 200 nm was formed as the upper electrode layer 4 by a sputtering method at room temperature to complete the thin-film piezoelectric element 10. In this case, the deposition rate was 0.2 nm/sec.

After the formation of the upper electrode layer 4, the piezoelectric thin film 3, the lower electrode layer 2, and the upper electrode layer 4 were patterned by photolithography, dry etching, and wet etching. Furthermore, the substrate 1 was cut to form the thin-film piezoelectric elements 10 each having a moving portion with a size of 25 mm×5 mm according to EXAMPLE 8.

Example 9

A silicon (100) substrate 1 having a thickness of 400 μm was heated to 400° C. Pt was epitaxially grown by a sputtering method on the silicon substrate 1 to form a 200-nm-thick Pt film serving as the lower electrode layer 2 in such a manner that the Pt film was oriented to the plane of the silicon substrate 1. In this case, the deposition rate was 0.2 nm/sec.

The silicon substrate 1 was heated to 550° C. Potassium sodium niobate (KNN) was epitaxially grown by a sputtering method with an argon-oxygen (Ar+$O_2$) gas mixture having an oxygen ($O_2$) concentration of 5% at a gas pressure of 0.2 Pa to form a 2000-nm-thick film serving as the piezoelectric thin film 3. As a power supply used for application, a high-frequency power supply was used. A sputtering target having a diameter of 150 mm was used. The output power was 800 W. The composition of the sputtering target used was the same as in EXAMPLE 1.

The piezoelectric thin film 3 was sputter-etched with argon gas at a gas pressure of 0.5 Pa. As a power supply used for application, a high-frequency power supply was used. The output power was 800 W and applied to an area with a diameter of 76 mm. A treatment time was 120 seconds. Then the surface roughness P-V and Ra of the treated surface were calculated.

A Pt film having a thickness of 200 nm was formed as the upper electrode layer 4 by a sputtering method at room temperature. In this case, the deposition rate was 0.2 nm/sec.

After the formation of the upper electrode layer 4, the piezoelectric thin film 3, the lower electrode layer 2, and the upper electrode layer 4 were patterned by photolithography, dry etching, and wet etching. Furthermore, the substrate 1 was cut to form the thin-film piezoelectric elements 10 each having a moving portion with a size of 25 mm×5 mm according to EXAMPLE 9.

Example 10

A silicon (100) substrate 1 having a thickness of 400 μm was heated to 400° C. Pt was epitaxially grown by a sputtering method on the silicon substrate 1 to form a 200-nm-thick Pt film serving as the lower electrode layer 2 in such a manner that the Pt film was oriented to the plane of the silicon substrate 1. In this case, the deposition rate was 0.2 nm/sec.

The lower electrode layer 2 was sputter-etched with argon gas at a gas pressure of 0.5 Pa. As a power supply used for application, a high-frequency power supply was used. The output power was 800 W and applied to an area with a diameter of 76 mm. A treatment time was 120 seconds. Then the surface roughness P-V and Ra of the treated surface were calculated.

The silicon substrate 1 was heated to 550° C. Potassium sodium niobate (KNN) to which Li (lithium), Ba (barium), Sr (strontium), Ta (tantalum), Zr (zirconium), and Mn (manganese) were added was epitaxially grown by a sputtering method with an argon-oxygen ($Ar+O_2$) gas mixture having an oxygen ($O_2$) concentration of 5% at a gas pressure of 0.2 Pa to form a 2000-nm-thick film serving as the piezoelectric thin film 3. As a power supply used for application, a high-frequency power supply was used. A sputtering target having a diameter of 150 mm was used. The output power applied was 800 W. The composition of the sputtering target used was as follows: $(Na_{0.591}K_{0.332}Li_{0.027}Ba_{0.002}Sr_{0.048})$ $(Nb_{0.944}Ta_{0.005}Zr_{0.051}) O_3$+0.040% by weight of MnO.

As with the lower electrode layer 2, the piezoelectric thin film 3 was sputter-etched under the same conditions.

The crystal grain size of the piezoelectric thin film 3 formed by the foregoing method was determined by observation with a transmission electron microscope (TEM) and found to be about 95 nm.

A Pt film having a thickness of 200 nm was formed as the upper electrode layer 4 by a sputtering method at room temperature. In this case, the deposition rate was 0.2 nm/sec.

After the formation of the upper electrode layer 4, the piezoelectric thin film 3, the lower electrode layer 2, and the upper electrode layer 4 were patterned by photolithography, dry etching, and wet etching. Furthermore, the substrate 1 was cut to form the thin-film piezoelectric elements 10 each having a moving portion with a size of 25 mm×5 mm according to EXAMPLE 10.

Example 11

The thin-film piezoelectric elements 10 according to EXAMPLE 11 were produced under the same conditions as in EXAMPLE 10, except that in the sputter-etching of the lower electrode layer 2 and the piezoelectric thin film 3 with argon gas, the output power of the high-frequency power supply was 550 W, and the treatment time was 50 seconds. In the course of the production, the surface roughness P-V and Ra of the treated surface were calculated.

Example 12

The thin-film piezoelectric elements 10 according to EXAMPLE 12 were produced under the same conditions as in EXAMPLE 10, except that in the sputter-etching of the lower electrode layer 2 and the piezoelectric thin film 3 with argon gas, the output power of the high-frequency power supply was 700 W, and the treatment time was 70 seconds. In the course of the production, the surface roughness P-V and Ra of the treated surface were calculated.

Comparative Example 1

Thin-film piezoelectric elements according to COMPARATIVE EXAMPLE 1 were produced as in EXAMPLE 1, except that the lower electrode layer and the piezoelectric thin film were not surface-treated. In the course of the production, the surface roughness P-V and Ra of the treated surface were calculated.

Comparative Example 2

Thin-film piezoelectric elements according to COMPARATIVE EXAMPLE 2 were produced as in EXAMPLE 1, except that the high-frequency power applied in the sputter-etching was 400 W and that the treatment time was 40 seconds. In the course of the production, the surface roughness P-V and Ra of the treated surface were calculated.

Comparative Example 3

Thin-film piezoelectric elements according to COMPARATIVE EXAMPLE 3 were produced as in EXAMPLE 1, except that the high-frequency power applied in the sputter-etching was increased to 1800 W and that the treatment time was increased to 240 seconds. In the course of the production, the surface roughness P-V and Ra of the treated surface were calculated.

Comparative Example 4

Thin-film piezoelectric elements according to COMPARATIVE EXAMPLE 4 were produced as in EXAMPLE 6, except that the grain size of the alumina abrasive grains used in the mechanical polishing was increased to 20 μm and that the pressure was increased to 2.0 MPa. In the course of the production, the surface roughness P-V and Ra of the treated surface were calculated.

Comparative Example 5

Thin-film piezoelectric elements according to COMPARATIVE EXAMPLE 5 were produced as in EXAMPLE 8, except that the treatment times of the wet etchings were increased to 350 minutes and 400 minutes, respectively. In the course of the production, the surface roughness P-V and Ra of the treated surface were calculated.

Table 1 describes the values of the surface roughness P-V and Ra of the surface-treated lower electrode layer 2 of each of the thin-film piezoelectric elements 10 according to EXAMPLES 1 to 8 and 10 to 12 and COMPARATIVE EXAMPLES 1 to 5; the values of the surface roughness P-V and Ra of the surface-treated piezoelectric thin film 3 of the thin-film piezoelectric element 10' according to EXAMPLE 9; and the amounts of displacement of the thin-film piezoelectric elements 10 and 10' measured by the application of a voltage of ±27 kV/cm at 120 Hz after each of the thin-film piezoelectric elements was fixed on a 18-μm-thick thin stainless steel plate having wiring of flexible cables.

In COMPARATIVE EXAMPLE 1, the lower electrode layer and the piezoelectric thin film were not surface-treated. Thus, the surface roughness P-V and Ra were small, compared with EXAMPLES 1 to 12. Hence, the amount of displacement of the thin-film piezoelectric element was small.

In EXAMPLES 1 and 2, as a result of the sputter-etching treatment of the lower electrode layer 2 and the piezoelectric thin film 3, the values of the surface roughness P-V and Ra in EXAMPLE 2, in which the high-frequency power was high and the treatment time was long, were high, and the amount of displacement was also large. The reason for this is presumably that the high values of the surface roughness P-V and Ra were able to be obtained under these treatment conditions, thereby increasing the amount of displacement. However, the amount of displacement was not ensured under the treatment conditions in COMPARATIVE EXAMPLE 3. The results imply that the set values of the treatment conditions are excessive values.

In EXAMPLE 3, the high-frequency power and the treatment time of the sputter-etching treatment is increased, compared with EXAMPLE 2. The values of the surface roughness P-V and Ra are both increased. However, the amount of displacement is reduced. The results demonstrate that the value of Ra is 280 nm, which is a relatively large value, and that at this level, an increase in surface area due to the surface treatment does not effectively affect an increase in amount of displacement. This implies that an appropriate range of Ra is present.

The same is true for the surface roughness P-V. In COMPARATIVE EXAMPLE 2, in which the high-frequency power and the treatment time of the sputter-etching treatment was reduced, compared with EXAMPLE 1, the surface roughness P-V was as small as 200 nm. The amount of displacement was significantly reduced, compared with EXAMPLE 1. This implies that an appropriate range of P-V is present.

In EXAMPLE 4, since the amount of the sputter-etching treatment was smaller than that in EXAMPLE 2, the surface roughness Ra was 160 nm, which is slightly smaller than that in EXAMPLE 2. The reason for this is presumably that since the value is smaller than an average grain size of 180 nm and that the treated surface is not appropriately bonded to the surface state of the lower electrode layer 2, thereby reducing the amount of displacement, compared with EXAMPLE 2.

In EXAMPLE 5, in which in the case where the thickness of the piezoelectric thin film 3 was increased, compared with EXAMPLE 2, the surface roughness PV and Ra of the lower electrode layer 2 and the piezoelectric thin film 3 are not changed. The amount of displacement does not reach that in EXAMPLE 2. The effect of the surface treatment is not provided to the extent of that in EXAMPLE 2. The reason for this is presumably that the amount of displacement in a range of the center portion in the thickness direction is dominant and that the amount of displacement is not increased because the surface area in this region is equal to the real region (area) of the piezoelectric thin film 3.

In EXAMPLES 6 and 7, in which the lower electrode layers 2 and the piezoelectric thin films 3 are subjected to the mechanical polishing treatment, the values of the surface roughness P-V and Ra are high in EXAMPLE 7, in which the abrasive grain size and the pressure are large. The reason for this is presumably that larger values of the surface roughness P-V and Ra can be obtained under the treatment conditions, thus resulting in an increase in the amount of displacement. However, the amount of displacement is not ensured under the conditions in COMPARATIVE EXAMPLE 4. This implies that the set values of the treatment conditions are excessive values.

In EXAMPLE 8, in which the lower electrode layer 2 and the piezoelectric thin film 3 were subjected to the wet etching treatment with the solutions appropriate for the layers, the values of the surface roughness P-V and Ra and the amount of displacement were increased, compared with COMPARATIVE EXAMPLE 1. However, the increment is small, compared with the surface treatment by the sputter-etching and mechanical polishing. This is presumably because the solutions are not highly erosive to the lower electrode layer or the piezoelectric thin film. However, the amount of displacement is not ensured under the conditions in COMPARATIVE EXAMPLE 5. The results demonstrate that increased treatment times of the wet etchings here are excessive settings.

As described in EXAMPLE 9, in the case where only the piezoelectric thin film 3 was surface-treated in the same way as in EXAMPLE 2, the amount of displacement was not obtained to the extent of that in EXAMPLE 2. The films having satisfactory crystallinity extend from the lower electrode layer 2 to the piezoelectric thin film 3. This seemingly ensures a relatively satisfactory amount of displacement.

The piezoelectric thin film 3 composed of additive-containing potassium sodium niobate (KNN) used in each of EXAMPLES 10 to 12 has an average crystal grain size of 95 nm, which is smaller than that in EXAMPLE 2. It is believed that the surface roughness obtained by the treatment is in a more suitable state for the crystal grains of the piezoelectric thin film 3, thus resulting in an increase in the amount of displacement. Among these, a larger value of Ra within the suitable range results in a larger amount of displacement. The reason for this is presumably that a larger number of crystal grains of the piezoelectric thin film 3 are bonded to the uneven shape of the surface of the lower electrode layer 2 to achieve the satisfactory crystal growth of the film.

The effect of the present invention has been described with the predetermined materials for the piezoelectric thin films and the electrode layers in the foregoing examples and comparative examples. It is obvious that even if any other materials for the piezoelectric thin film and the electrode layers are used, the same effect as the present invention is provided by virtue of the substantial increase in interfacial area as long as the surface roughness at the interface as described in the present invention is achieved.

TABLE 1

| | Method for treating lower electrode layer | Method for treating piezoelectric thin film | P-V [nm] | Ra [nm] | Amount of displacement [nm] |
|---|---|---|---|---|---|
| EXAMPLE 1 | sputter-etching 1 Ar 0.5 Pa 600 W 60 sec | sputter-etching 1 Ar 0.5 Pa 600 W 60 sec | 250 | 100 | 1950 |
| EXAMPLE 2 | sputter-etching 2 Ar 0.5 Pa 800 W 120 sec | sputter-etching 2 Ar 0.5 Pa 800 W 120 sec | 300 | 200 | 2300 |
| EXAMPLE 3 | sputter-etching 3 Ar 0.5 Pa 1200 W 180 sec | sputter-etching 3 Ar 0.5 Pa 1200 W 180 sec | 480 | 280 | 1700 |

TABLE 1-continued

| | Method for treating lower electrode layer | Method for treating piezoelectric thin film | P-V [nm] | Ra [nm] | Amount of displacement [nm] |
|---|---|---|---|---|---|
| EXAMPLE 4 | sputter-etching 4<br>Ar 0.5 Pa<br>750 W 90 sec | sputter-etching 4<br>Ar 0.5 Pa<br>750 W 90 sec | 280 | 160 | 2000 |
| EXAMPLE 5 | sputter-etching 2<br>Ar 0.5 Pa<br>800 W 120 sec | sputter-etching 2<br>Ar 0.5 Pa<br>800 W 120 sec | 300 | 200 | 1800 |
| EXAMPLE 6 | mechanical polishing 1<br>alumina abrasive grains<br>5 μm<br>0.8 MPa | mechanical polishing 1<br>alumina abrasive grains<br>5 μm<br>0.8 MPa | 330 | 110 | 2000 |
| EXAMPLE 7 | mechanical polishing 2<br>alumina abrasive grains<br>10 μm<br>1.2 MPa | mechanical polishing 2<br>alumina abrasive grains<br>10 μm<br>1.2 MPa | 370 | 130 | 2100 |
| EXAMPLE 8 | wet etching 1<br>$HNO_3$ + HCl (1:3)<br>90 min | wet etching 2<br>$HNO_3$ + HF (5:5)<br>100 min | 240 | 80 | 1700 |
| EXAMPLE 9 | untreated | sputter-etching 2<br>Ar 0.5 Pa<br>800 W 120 sec | 280 | 200 | 1800 |
| EXAMPLE 10 | sputter-etching 2<br>Ar 0.5 Pa<br>800 W 120 sec | sputter-etching 2<br>Ar 0.5 Pa<br>800 W 120 sec | 300 | 210 | 2400 |
| EXAMPLE 11 | sputter-etching 5<br>Ar 0.5 Pa<br>550 W 50 sec | sputter-etching 5<br>Ar 0.5 Pa<br>550 W 50 sec | 230 | 90 | 1900 |
| EXAMPLE 12 | sputter-etching 6<br>Ar 0.5 Pa<br>700 W 70 sec | sputter-etching 6<br>Ar 0.5 Pa<br>700 W 70 sec | 270 | 130 | 2200 |
| COMPARATIVE EXAMPLE 1 | untreated | untreated | 50 | 10 | 1200 |
| COMPARATIVE EXAMPLE 2 | sputter-etching 7<br>Ar 0.5 Pa<br>400 W 40 sec | sputter-etching 7<br>Ar 0.5 Pa<br>400 W 40 sec | 200 | 70 | 1100 |
| COMPARATIVE EXAMPLE 3 | sputter-etching 8<br>Ar 0.5 Pa<br>1800 W 240 sec | sputter-etching 8<br>Ar 0.5 Pa<br>1800 W 240 sec | 550 | 250 | 1100 |
| COMPARATIVE EXAMPLE 4 | mechanical polishing 3<br>alumina abrasive grains<br>20 μm<br>2.0 MPa | mechanical polishing 3<br>alumina abrasive grains<br>20 μm<br>2.0 MPa | 1200 | 500 | 1000 |
| COMPARATIVE EXAMPLE 5 | wet etching 3<br>$HNO_3$ + HCl (1:3)<br>350 min | wet etching 4<br>$HNO_3$ + HF (5:5)<br>400 min | 520 | 350 | 1050 |

What is claimed is:

1. A thin-film piezoelectric element, comprising a pair of electrode layers and a piezoelectric thin film sandwiched between the pair of electrode layers, wherein a surface roughness P-V of an interface between the piezoelectric thin film and at least one of the pair of electrode layers is 220 nm or more and 500 nm or less, wherein the surface roughness P-V is defined by a difference between a maximum height (peak value P) and a minimum height (valley value V).

2. The thin-film piezoelectric element according to claim 1, wherein a surface roughness Ra of the interface is 90 nm or more and 220 nm or less, and the surface roughness Ra is larger than an average crystal grain size of crystal grains constituting the piezoelectric thin film.

3. The thin-film piezoelectric element according to claim 1, wherein the piezoelectric thin film has a thickness of 220 nm or more and 3000 nm or less.

4. The thin-film piezoelectric element according to claim 1, wherein the piezoelectric thin film is a potassium sodium niobate-based piezoelectric thin film.

5. A thin-film piezoelectric actuator comprising the thin-film piezoelectric element according to claim 1.

6. A thin-film piezoelectric sensor comprising the thin-film piezoelectric element according to claim 1.

7. A hard disk drive comprising the thin-film piezoelectric actuator according to claim 5.

8. An ink jet printer apparatus comprising the thin-film piezoelectric actuator according to claim 5.

* * * * *